United States Patent
Peukert et al.

(10) Patent No.: US 10,651,847 B2
(45) Date of Patent: May 12, 2020

(54) SWITCHING APPARATUS FOR A CONTROL SYSTEM FOR A VEHICLE, AND CONTROL SYSTEM FOR A VEHICLE

(71) Applicants: ZF Friedrichshafen AG, Friedrichshafen (DE); Lemförder Electronic GmbH, Espelkamp (DE)

(72) Inventors: Andreas Peukert, Barnstorf (DE); Ralf Pfeifer, Diepholz (DE)

(73) Assignees: ZF Friedrichshafen AG, Friedrichshafen (DE); Lemförder Electronic GmbH, Espelkamp (DE)

( * ) Notice: Subject to any disclaimer, the term of this patent is extended or adjusted under 35 U.S.C. 154(b) by 306 days.

(21) Appl. No.: 15/523,118

(22) PCT Filed: Sep. 29, 2015

(86) PCT No.: PCT/EP2015/072343
§ 371 (c)(1),
(2) Date: Apr. 28, 2017

(87) PCT Pub. No.: WO2016/066356
PCT Pub. Date: May 6, 2016

(65) Prior Publication Data
US 2017/0321801 A1  Nov. 9, 2017

(30) Foreign Application Priority Data
Oct. 29, 2014  (DE) .................. 10 2014 221 986

(51) Int. Cl.
*H03K 17/968*  (2006.01)
*F16H 59/04*  (2006.01)
(Continued)

(52) U.S. Cl.
CPC ......... *H03K 17/968* (2013.01); *F16H 59/044* (2013.01); *F16H 61/32* (2013.01);
(Continued)

(58) Field of Classification Search
CPC ...... G02B 6/3552; G02B 6/3574; G02B 6/35; G02B 6/3502; G02B 6/3504;
(Continued)

(56) References Cited

U.S. PATENT DOCUMENTS 3,886,544 A   5/1975  Narodny
4,170,731 A * 10/1979  Howell .................. G02B 6/353
                                                250/227.22
(Continued)

FOREIGN PATENT DOCUMENTS

DE  10 2008 001 884 A1  11/2009
WO  WO 89/09515        10/1989
WO  WO 00/68719        11/2000

OTHER PUBLICATIONS

International Search Report and Written Opinion of the International Search Authority dated Dec. 18, 2015 in International Application No. PCT/EP2015/072343 (English and German languages) (10 pp.).

*Primary Examiner* — Jeremy R Severson
(74) *Attorney, Agent, or Firm* — Brinks Gilson & Lione

(57) ABSTRACT

The present disclosure relates to a shift device for a control system for a vehicle. The shift device may include at least one optical fiber for conducting a light signal, where the light signal has an input characteristic when entering the shift device, and where the light signal has an output characteristic when exiting the shift device. The shift device may further include a control element, where the control element can be moved between a home position, a first actuation position, and a second actuation position by an actuation force. The control element may have an adjustment device for adjusting the characteristic of the light signal, where the adjustment device is configured to set the output characteristic of the light signal to a first value when the control element is in the home position.

16 Claims, 6 Drawing Sheets

(51) Int. Cl.
*F16H 61/32* (2006.01)
*F16H 63/34* (2006.01)
*G01D 5/353* (2006.01)
*F16H 59/02* (2006.01)

(52) U.S. Cl.
CPC ..... *F16H 63/3458* (2013.01); *G01D 5/35341* (2013.01); *G01D 5/35374* (2013.01); *F16H 2059/0295* (2013.01); *H03K 2217/9655* (2013.01)

(58) Field of Classification Search
CPC .............. G02B 6/3508; H03K 17/968; H03K 2217/9655; H03K 2217/9653; H03K 2217/9656
See application file for complete search history.

(56) References Cited

U.S. PATENT DOCUMENTS

| | | | | |
|---|---|---|---|---|
| 4,480,184 | A * | 10/1984 | Ely | G02B 6/2804 |
| | | | | 250/227.22 |
| 6,181,847 | B1 * | 1/2001 | Baker | G02B 6/353 |
| | | | | 385/16 |
| 7,082,233 | B2 * | 7/2006 | Saito | G02B 6/25 |
| | | | | 385/16 |
| 7,113,689 | B2 * | 9/2006 | Hong | G02B 6/266 |
| | | | | 359/227 |
| 8,438,987 | B2 * | 5/2013 | Rake | F16H 63/42 |
| | | | | 116/28.1 |
| 2011/0259722 | A1 * | 10/2011 | Alderson | H01H 23/04 |
| | | | | 200/339 |

* cited by examiner

SWITCHING APPARATUS FOR A CONTROL SYSTEM FOR A VEHICLE, AND CONTROL SYSTEM FOR A VEHICLE

CROSS-REFERENCE TO RELATED APPLICATIONS

This application is a filing under 35 U.S.C. § 371 of International Patent Application PCT/EP2016/066356, filed Sep. 29, 2015, and claims the priority of German Patent Application 10 2014 221986.8, filed Oct. 29, 2014. These applications are herein incorporated by reference in their entireties.

TECHNICAL FIELD

The present disclosure relates to an electronic transmission control device. Furthermore, the present disclosure relates to a method for the production of an electronic transmission control device.

The present disclosure relates to a shift device for a control system for a vehicle and a control system for a vehicle having such a shift device, in particular for a control element, e.g. a gear step selection device of a vehicle.

BACKGROUND

By way of example, with gearshift levers having electronic components, a complicated construction of a gearshift lever may be necessary due to the design preferences of a client. A motherboard, for example, may be required thereby in a base of the gearshift lever, and one or more secondary printed circuit boards may be needed in the gearshift handle or knob. Such a secondary printed circuit board in the knob can support, in particular, switches, e.g. a P-button for setting a parking mode of a transmission, a release button for releasing the parking mode of a transmission, and a button for activating a manual mode, a manual channel or a touch shift control, as well as light emitting diodes for a gear step display and a background lighting. Because there is normally too little space in the knob, it may be the case that not all of the components can be accommodated therein, making it necessary to split them up, or subdivide them. The motherboard and secondary printed circuit boards are normally connected to one another in an electrically conductive manner.

DE 10 2008 001 884 A1 discloses an actuation device having optical fiber bundles.

Based on this, the present embodiments create an improved shift device for a control system for a vehicle, and an improved control system for a vehicle in accordance with the independent Claims. Advantageous designs can be derived from the dependent Claims and the following description.

In accordance with embodiments of the present disclosure, in particular an optical or opto-electronic monitoring of peripherally disposed shift devices can be implemented, which can be designed as multi-step buttons or switches, or step buttons or step switches. By way of example, optical fibers and other advantageous mechanisms, for example, may be used for transmitting shift settings in an optical signal conducted by optical fiber. In other words, light switches may be used for monitoring peripheral shift devices.

Advantageously, according to embodiments of the present disclosure, a shift device can be accommodated at a spacing to a control device and/or, under demanding geometrical conditions, in a space saving manner that can be flexibly adapted to the design preferences or client preferences, monitored opto-electronically, and optically connected to the control device. Thus, with distributed shift devices or operating elements, electrical components or functions can be disposed individually on a motherboard.

Such an optical connection of peripheral, multi-step shift devices on a centrally disposed control unit can provide advantages, because optical fibers are not sensitive to electric and magnetic disruptions. Furthermore, peripheral electronic components, e.g. in a knob of a gearshift lever for a vehicle transmission can be eliminated. Peripheral buttons or switches function thereby without electrical components. Furthermore, only one central control unit needs to be configured regarding safety regulations pertaining to electronics. Lastly, a high level of system stability and reliability can be achieved due to the elimination of secondary printed circuit boards and wiring.

In particular, a product safety can be increased, because components relevant to safety, which could pose particular risk factors in the control system, can be replaced. In particular with control systems having distributed peripheral shift devices or components, a reduction in development costs as well as unit costs can be achieved, because a functional safety only needs to be implemented in the central control device, and only optical fibers and bundle adapters are needed in order to interconnect the system components, for example, and an otherwise necessary seal for peripheral electronics can be eliminated. Better diagnostic measures can be implemented as well, because, due to the optical connection of at least one shift device to a control device, a universal and reliable diagnosis is possible, without limitations regarding different electrical specifications of the components.

Compared with an electrical interconnection, expenditures regarding parts and costs can be reduced with the optical interconnection according to embodiments of the present disclosure. Furthermore, the problem that electrical cable harnesses cannot have an arbitrarily large number of cables, for example, because the plugs, in particular, would otherwise have to be very large, such that it is frequently only possible to use flat plugs, although a structural space may be limited, can be avoided. In particular when used in conjunction with a shift lever, or a gearshift lever for a vehicle transmission or a vehicle drive, a shift rod may have a limited inner diameter, and it is possible that shift lever covers, which might hide such electrical cables, may not be desired by the client. Thus, it is possible to improve the adaptability to limited or complex forms, or a design freedom can be increased, according to embodiments of the present disclosure. Because system components for interconnected and/or peripheral electronics no longer have to be protected against a spilling of liquids, the effort required for sealing the control system can be reduced. Likewise, flex foil no longer needs to be used, for example, for connecting peripheral components, which on one hand requires a special constructional design in order that it not fall off prematurely, but on the other hand cannot simply replace a conventionally implemented secondary printed circuit board in terms of all of its applications. Because, according to embodiments of the disclosure, it is possible, in particular, to avoid providing functions relevant to safety on a secondary printed circuit board that is obsolete according to embodiments of the disclosure, a particularly simple development and implementation of control systems is enabled.

SUMMARY

A shifting system for a control system for a vehicle has the following features:

at least one optical fiber for conducting a light signal, wherein the light signal has an input characteristic when entering the shift device, and has an output characteristic when exiting the shift device; and a control element for applying an actuation force to the shift device, wherein the control element can be moved by the actuation force between a home position, a first actuation position and a second actuation position, wherein the control element has an adjustment device for setting a characteristic of the light signal, wherein the adjustment device is designed to set the output characteristic of the light signal to a first value when the control element is in the home position, to set the output characteristic of the light signal to a second value when in the first actuation position, and to set the output characteristic of the light signal to a third value when in the second actuation position, wherein the first value, the second value and the third value differ from one another.

The vehicle can be a land vehicle, a water vehicle or an aircraft, in particular a street vehicle, e.g. a passenger car, a truck or another utility vehicle. The shift device can be a button or a switch, in particular a multi-step button or switch, e.g. a step-button, a rocker switch, a slider switch, or suchlike. The actuation force can be exerted on the control element by an operator. The control element can be moved thereby from the home position into the first actuation position, and from the first actuation position into the second actuation position when the actuation force is applied. In the subsequent absence of the actuation force, the control element can return, or be returned, from the second actuation position or the first actuation position into the home position. The at least one optical fiber can be designed as an optical fiber bundle or as part of an optical fiber bundle. The control element can also be moved into at least one actuation position. The adjustment device can be designed to influence the characteristic of the light signal differently in the individual actuation positions, and potentially to not influence it in one of the actuation positions. The adjustment device can be designed thereby to set the output characteristic of the light signal to at least one other value in the at least one further actuation position. The at least one optical fiber can also be a component of the control system, wherein the at least one optical fiber can be provided separately from the shift device.

According to one exemplary embodiment, the adjustment device can have at least one pressure section, which is designed to alter a curvature radius of the at least one optical fiber, depending on a position of the control element. The at least one optical fiber can be designed here as an at least continuous optical fiber, which extends from an input side of the shift device to an output side of the shift device. The at least one pressure section can be formed as a projecting section of the control element. In the home position, the at least one pressure section can be spaced apart from the at least one optical fiber, for example, and in the actuation position, the at least one light switch can be bendable by the at least one pressure section, for example. Such an embodiment offers the advantage that the light signal can be dampened differently by light extraction, depending on a setting of the control element, such that different values can be set for the output characteristic in a reliable and structurally simple manner, and a beneficial shifting behavior of the shift device can be achieved.

Alternatively, the adjustment device can have at least one damper section, which is designed to at least partially allow the light signal to pass through the at least one optical fiber, depending on a setting of the control element, and additionally or alternatively, to at least partially dampen or interrupt it. The at least one optical fiber can have at least one first optical fiber and at least one second optical fiber thereby. The at least one first optical fiber can extend thereby from an input side of the shift device for a first section through the shift device, and the at least one second optical fiber can extend for a second section through the shift device to an output side of the shift device. An intermediate space may be disposed between the at least one first optical fiber and the at least one second optical fiber. The at least one damper section can be designed such that it can be moved or displaced in the intermediate space between the optical fibers, depending on a setting of the control element. Such an embodiment offers the advantage that different values for the output characteristic can also be safely and structurally simply set in this manner, in order to improve a shifting behavior of the shift device.

The at least one damper section can have an interruption section, a optical element, a reflector, and additionally or alternatively, an absorber. The interruption section can be made of an optically transparent, and additionally or alternatively, non-reflecting material. The reflector can be made of an optically reflecting material. The absorber can be made of an optically non-reflecting material having a matt surface. In particular, the at least one damper section can have a reflector and at least one absorber, and additionally or alternatively, an interruption section, wherein a longitudinal axis of the at least one first optical fiber and a longitudinal axis of the at least one second optical fiber can run transverse to one another. Alternatively, the at least one damper section can have an interruption section and optionally, a optical element. Such an embodiment offers the advantage that the damping of the optical signal, the different values of the output characteristic, and thus the beneficial shifting behavior of the shift device can be implemented in a manner that can be flexibly adapted to a geometry at an installation position.

The adjustment device can also have at least one further optical fiber, which is designed to at least partially allow the light signal to pass through the at least one optical fiber, depending on a position of the control element, and additionally or alternatively, to redirect it at least in part to the control element. The at least one optical fiber can have at least one first optical fiber and at least one second optical fiber thereby. The at least one first optical fiber can extend thereby from an input side of the shift device for a first section through shift device, and the at least one second optical fiber can extend for a section through the shift device to an output side of the shift device. An intermediate space can be disposed between the at least one first optical fiber and the at least one second optical fiber. The at least one further optical fiber can be designed such that it can be moved or displaced in the intermediate space between the optical fibers, depending on a setting of the control element. The at least one further optical fiber can be designed to provide a light signal of a lighting device redirected to the control element. Such an embodiment offers the advantage that not only different values for the output characteristic can be reliably set in a structurally simple manner, in order to improve a shifting behavior of the shift device, but an illumination of the shift device, or the control element, respectively, can also be implemented.

Alternatively, the adjustment device can have at least one filter, which is designed to allow the light signal to pass through the at least one optical fiber, at least partially unfiltered, and additionally or alternatively, to at least partially filter it. The at least one optical fiber can have at least one first optical fiber and at least one second optical fiber thereby. The at least one first optical fiber can extend for a first section through the shift device from an input side of the shift device, and the at least one second optical fiber can extend for a second section through the shift device to an output side of the shift device. An intermediate space can be disposed between the at least one first optical fiber and the at least one second optical fiber. The at least one filter can be designed such that it can be moved or displaced in the intermediate space between the optical fibers, depending on a setting of the adjustment element. The at least one filter can be a polarizing filter or a color filter. Such an embodiment offers the advantage that a modification of the light signal by means of filters can also deliver values for the output characteristic that can be easily distinguished in order to achieve a beneficial shifting behavior of the shift device.

According to one exemplary embodiment, the input characteristic and the output characteristic of the light signal can represent a light intensity or a luminous flux. The light intensity can relate to an illumination, a specific light emission, a light density, a brightness, a luminous flux, a light quantity, an exposure or a light output. Alternatively, the input characteristic and the output characteristic of the light signal can be a polarization property, a color, or suchlike. Such an embodiment offers the advantage that on the basis of such characteristics, different values for the output characteristic of the light signal can be generated in a simple manner, which enables a beneficial shifting behavior of the shift device.

In particular, the first value of the output characteristic can represent a maximum value. The third value of the output characteristic can represent a minimum value thereby. The second value of the output characteristic can represent an intermediate value between the maximum value and the minimum value thereby. By way of example, the output characteristic can represent a light intensity or a luminous flux thereby. Such an embodiment offers the advantage that an existence of a maximum luminous flux or suchlike in the home position, or in a standby setting, simplifies or enables a cyclical diagnosis of optical components, in particular in the case of a button as the shift device. Alternatively, the first value of the output characteristic can represent a minimum value, and the third value of the output characteristic can represent a maximum value.

Furthermore, the shift device can have a spring device for applying a spring force counter to the actuation force to the control element. The spring device can be designed thereby to regulate a multi-step movement of the control element between the home position, the first actuation position, and the second actuation position. Optionally, the shift device can have numerous spring devices having different spring constants, or spring forces that can be exerted, respectively. The at least one spring device can have a plate spring, for example. Such an embodiment offers the advantage that the multi-stepped shifting movement of the shift device, or the control device, respectively, can be implemented in a precisely definable manner regarding a movement path of the control element, and in a structurally simple manner.

In the home position, the control element and the at least one spring element can be decoupled in terms of force transfer thereby. In the first actuation position, a transfer of force between the control element and the at least one spring device may be at a minimum. In the second actuation position, a transfer of force between the control element and the at least one spring device may be at a maximum. The at least one spring device can be designed thereby to exert a minimum spring force on the control element at the minimum transfer of force, and to exert a maximum spring force on the control element at the maximum transfer of force. Such an embodiment offers the advantage that an at least two-step shift movement of the control element can be implement in a structurally simple manner, and in a manner that is unambiguous in a haptic sense to a user.

The control element can also have a button, a switch, a rocker button, a rocker switch, or a slider. Such an embodiment offers the advantage that there are a number of application possibilities or design possibilities to choose from for the shift device.

According to one exemplary embodiment, the shift device can have a continuous optical fiber and at least one spring device for applying a spring force counter to the actuation force to the control element. The spring device can be designed thereby to regulate a multi-step movement of the control element between the home position, the first actuation position, and the second actuation position. The adjustment device can have at least one pressure section thereby, which is designed to alter a curvature radius of the at least one optical fiber, depending on a position of the control element. The optical fiber can be disposed thereby between the at least one pressure section and the spring device. Such an embodiment offers the advantage that a space-saving and economical shift device can be created, having a reduced number of parts.

A control system for a vehicle has the following features: an embodiment of the shift device specified above; and a control device, wherein the shift device is connected via the at least one optical fiber to the control device such that it is capable of data transfer, wherein the control device has a device for coupling the light signal with the input characteristic in the at least one optical fiber, and a device for determining the output characteristic of the light signal from the at least one optical fiber, wherein the control device is designed to generate a control signal that is a function of a value of the output characteristic of the light signal.

In conjunction with the control system, an embodiment of the aforementioned shift device can be advantageously used in order to provide different values of the output characteristic of the light signal, based on which a control signal or shifting signal can be generated. The control system can have at least one such shift device. The control device can have a printed circuit board or it can be disposed or disposable on a printed circuit board. The device for coupling can have a light source, in particular a light emitting diode. The device for determination can have a phototransistor or suchlike. The at least one optical fiber can be designed thereby as a closed or open loop running from the control device through the shift device and back to the control device.

According to one embodiment, the control device can be designed to send the control signal to an interface to a motor control device and additionally or alternatively to an interface to a transmission control device. With a processing by the motor control device and additionally or alternatively the transmission control device, the control signal can be suited for effecting a control or regulation of a drive thereof. Such an embodiment offers the advantage that a vehicle transmission and/or a vehicle drive can be controlled when the control signal generated by the shift device on the basis of the output characteristic value is used.

The control signal can be designed thereby to generate a first control signal in response to the second value of the output characteristic, which represents a pre-selection signal for pre-selecting a gear step, and to generate a second control signal in response to the third value of the output characteristic, which represents a shifting signal for shifting to a gear step. Such an embodiment offers the advantage that, due to the fact that for a shifting operation to another gear, or other gear step, for example, a shift is made to another auxiliary shaft in many types of transmission, a correct and useful preliminary information for a transmission control can already be provided, such that an otherwise potentially necessary correction to an estimated pre-selection can be eliminated, and time is saved, in particular in order that a driver can prepare to shift quickly, for example, in order to prepare to overtake another vehicle with a pre-selection of a gear.

The control device can also be designed to generate a first control signal in response to the second value of the output characteristic, which represents a motor start-up signal, and to generate a second control signal in response to the third value of the output characteristic, which represents a disengagement signal for releasing a transmission locking. Such an embodiment offers the advantage that different vehicle functions can be activated by the multi-step shift device of the control system, wherein such a reasonable consolidation of functionalities as well as a simplified operability of the vehicle can be obtained.

BRIEF DESCRIPTION OF THE DRAWINGS

The present embodiments shall be explained in greater detail based on the attached drawings. Therein.

DETAILED DESCRIPTION

In the following description of preferred exemplary embodiments of the present disclosure, the same reference symbols are used for the elements depicted in the various Figures and having similar functions, wherein there shall be no repetition of the description of these elements.

Figure 1:
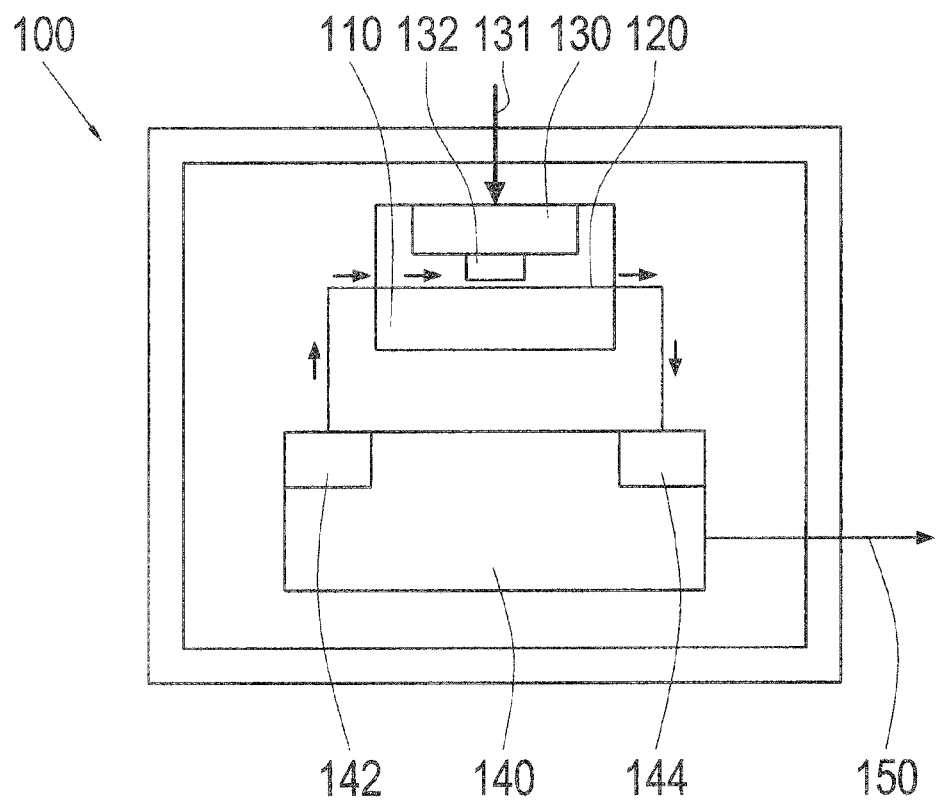
FIG. 1 shows a control system having a shift device according to an exemplary embodiment of the present disclosure.

FIG. 1 shows a control system 100 having a shift device 110 according to an exemplary embodiment of the present disclosure. The control system 100 is provided for use in a vehicle, or can be used in conjunction with a vehicle. By way of example, the control system 100 can be used to control a vehicle transmission and additionally or alternatively, a vehicle drive.

The control system 100 has a shift device 110 according to the exemplary embodiment of the present disclosure depicted in FIG. 1. According to another exemplary embodiment, the control system 100 can have multiple shift devices 110.

The shift device 110 has an optical fiber 120 according to the exemplary embodiment of the present disclosure depicted in FIG. 1. The optical fiber 120 is designed to conduct a light signal. A direction of propagation of the light signal is symbolically illustrated in FIG. 1 by arrows. The optical fiber 120 extends through the shift device 110. A light signal conducted in the optical fiber 120 has an input characteristic thereby when it enters the shift device 110. When exiting the shift device 110, the light signal has an output characteristic. Optionally, the optical fiber 120 can also have at least one interruption inside the shift device 110, even if this is not explicitly depicted in FIG. 1. According to another exemplary embodiment, multiple optical fibers 120 can also be disposed therein.

Furthermore, the shift device 110 of the control system 100 has a control element 130. The control element 130 can be, e.g., a button, a switch, a rocker button, a rocker switch or a slider. The control element 130 is designed to exert an external actuation force 131 on the shift device 110. In other words, the control element 130 is designed to exert an actuation force 131 by a user on the shift device 120, or the adjustment device 132, and optionally to transfer it to the optical fiber 120. The control element 130 is disposed such that it can be moved to different positions by means of an actuation force 131 applied to the shift device 110 or the control element 130, such that it can be moved, in particular between a home position, a first actuation position and a second actuation position, depending on the actuation force 131.

The home position of the control element 130 corresponds thereby to an absence of the actuation force 131, or a standby setting of the control element 130. The first actuation position of the control element 130 represents, e.g., a first step of a movement or actuation movement of the control element 130 when actuation force 131 is applied. The second actuation position of the control element 130 represents, in particular, a second step of the actuation movement of the control element 130, or, e.g., a stop position of the control element 130 in the shift device 110 when actuation force 131 is applied. According to another exemplary embodiment, the control element 130 can be moved between more than three positions.

The control element 130 has an adjustment device 132 according to the exemplary embodiment of the present disclosure depicted in FIG. 1. The adjustment device 132 is mechanically coupled or connected to the control element 130 thereby. The adjustment device 132 is designed to set an output characteristic of a light signal conducted in the optical fiber 120 through the shift device 110. Specifically, the adjustment device 132 is designed to set the output characteristic to one of numerous different values, depending on a position of the control element 130.

The adjustment device 132 is designed thereby to set the output characteristic of the light signal to a first value when the control element 130 is in the home position. Furthermore, the adjustment device 132 is designed to set the output characteristic of the light signal to a second value when the control element 130 is in the first actuation position. The adjustment device 132 is also designed to set the output characteristic of the light signal to a third value when the control element 130 is in the second actuation position. The first value, second value and third value differ thereby.

According to one exemplary embodiment, the input characteristic and the output characteristic of the light signal represent a light intensity of the light signal. In particular, the input characteristic and the output characteristic of the light signal represent a luminous flux, an illumination, a luminous flux, a light quantity, an exposure, or a light output of the light signal. Alternatively, the input characteristic and the output characteristic of the light signal represent a polarization property or a color of the light signal. According to one exemplary embodiment, the first value of the output characteristic is a maximum value or level of a light intensity of the optical signal, and the third value of the output characteristic is a minimum value or level of a light intensity of the optical signal.

The control system also has a control device 140. The control device 140 is connected to the shift device 110 such that it can transfer data thereby by means of the optical fiber 120. The optical fiber 120 is designed in the form of a loop thereby, in order to create a connection between the control device 140 and the shift device 110 that is capable of data transfer.

The control device 140 has a coupling device 142 and a detection device 144. The coupling device 142 is designed thereby to couple the light signal having the input characteristic in the optical fiber 120. The coupling device 142 has a light source, which is designed, for example, as a light emitting diode. The detection device 144 is designed to detect the light signal or the output characteristic of the light signal from the optical fiber 120. The detection device 144 is designed thereby as a phototransistor, for example.

The control device 140 is designed to generate a control signal 150 as a function of a value of the output characteristic of the light signal determined by means of the detection device 144. The control device 140 is designed thereby, in particular, to generate a different control signal 150 depending on an existing value of the output characteristic. The control device 140 is also designed to transmit or provide the control signal 150 to an interface for a device.

By way of example, the control device 140 can be designed to generate a first control signal 150 or to interrupt a generation of a control signal 150 when an output characteristic having the first value is detected, wherein the control element 130 is disposed in the home position. When an output characteristic having the second value or the third value has been detected, wherein the control element 130 is disposed in the first actuation position or the second actuation position, the control device 140 can be designed to generate a second control signal 150 or a third control signal 150.

According to one exemplary embodiment, the control device 140 is designed to transmit the control signal 150 to an interface for a motor control device and to an interface for a transmission control device. The control device 140 is designed thereby to generate a first control signal 150 in response to the second value of the output characteristic of the light signal, which represents a motor start-up signal, and to generate a second control signal 150 in response to the third value of the output characteristic of the light signal, which represents an unlocking signal for releasing a transmission lock and/or releasing a gearshift lever. By way of example, a vehicle start-up or motor start-up can thus be implemented by a two-step P-shift on a gearshift lever of a vehicle. In order to generate the first control signal 150, the control device 140 can be designed thereby to check whether the first actuation position of the control element 130 of the shift device 110 has been applied for a defined period of time, e.g. at least half a second, in order to cause a motor start-up. In particular, a vehicle start-up can thus be functionally linked to disengagement button, or unlock-button on a gearshift lever of a vehicle. If the shift device 110 is actuated into the first actuation position for a specific time period, e.g. one second, then it is possible to cause the motor of the vehicle to be started up. When the shift device 110 is placed in the second actuation position, a transmission lock can be released, and a shifting to another gear or another gear step can be enabled.

According to one exemplary embodiment, the control device 120 is designed to transmit the control signal 150 to an interface for a transmission control device. The control device 140 is designed thereby to generate a first control signal 150 in response to the second value of the output characteristic of the light signal, which represents a pre-selection signal for pre-selecting a gear step, or a gear, and to generate a second control signal 150 in response to the third value of the output characteristic of the light signal, which represents a shifting signal for setting a gear step or for engaging a gear. A use of a multi-step button as the shift device 110 in the vehicle can be, for example, a two-step rocker button for shifting in the so-called manual channel. Thus, a pre-controlling of transmissions, or a gear selection by a two-step shifter in the manual channel can be implemented. Regarding an up-shifting (M+) and a down-shifting (M−) in the manual channel, it can be signaled by the first actuation position of the shift device 110 that an up-shifting or down-shifting is intended as the next manual gear selection. The actual shifting procedure can be carried out on the basis of the second actuation position.

Figure 2A:
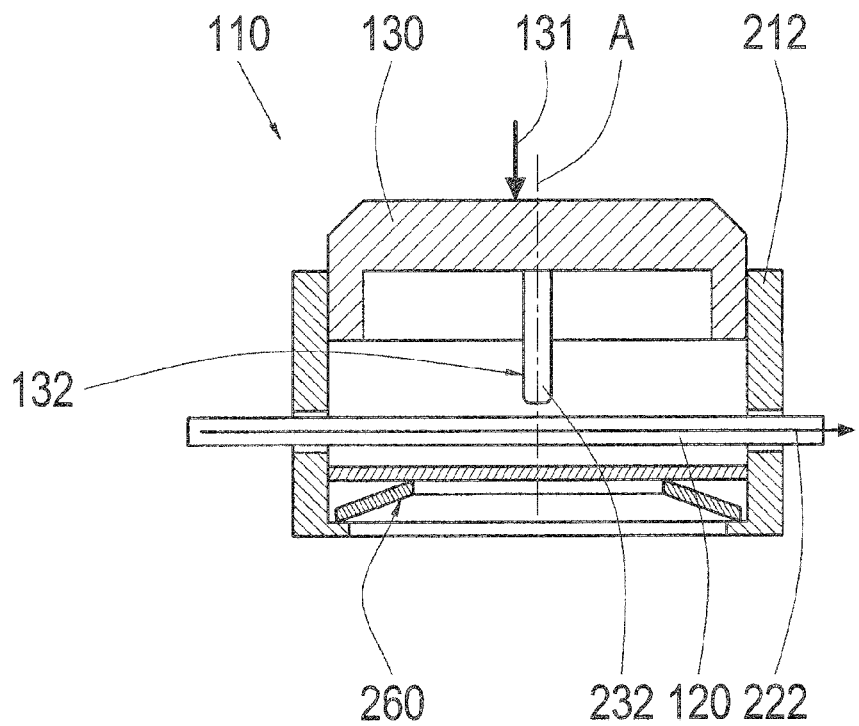
FIGS. 2A to 7B show shift devices according to exemplary embodiments of the present disclosure.

FIG. 2A shows a sectional illustration of a shift device 110 according to an exemplary embodiment of the present disclosure. The shift device 110 can be the shift device from FIG. 1. The shift device 110 includes the optical fiber 120, the control element 130, and the adjustment device 132. Furthermore, FIG. 2A shows a housing 212 of the shift device 120, a light signal 22 in the optical fiber 120, a pressure section 232 of the adjustment device 132, a spring device 260 of the shift device 110, and an actuation axis A, or movement axis of the control element 130. The shift device 110 is shown in FIG. 2A in a home position of the control element 130 thereby.

A subsection of the optical fiber 120, a subsection of the control element 130 depending on the position of the control element 130, the adjustment device 132, and the spring device 260 are disposed in the housing 212.

According to the exemplary embodiment of the present disclosure depicted in FIG. 2A, the optical fiber 120 is formed as a continuous optical fiber. The light signal 22 is conducted along a light path in the optical fiber 120, as is symbolically illustrated by an arrow in the Figure. The optical fiber 120 extends thereby linearly through the shift device 110 in the home position of the control element 130 shown in FIG. 2A. The optical fiber 120 has a main extension axis, or longitudinal axis, inside the housing 212, which corresponds to the light path of the light signal 222 in the home position of the control element 130 shown in FIG. 2A.

The control element 130 is designed as a button. In the home position depicted in FIG. 2A, a maximum subsection of the control element 130 extends out of the housing 212. When an actuation force 131 is exerted, the control element 130 can be moved along the actuation axis A between the different positions. The actuation axis A extends thereby along the longitudinal axis of the optical fiber 120, or transverse thereto, in the exemplary embodiment depicted in FIG. 2A, within production tolerances.

The adjustment device 132 has a pressure section 232 or a pressure element according to the exemplary embodiment of the present disclosure depicted in FIG. 2A. The pressure section 232 has, specifically, a rod-shaped profile having a main extension axis. The main extension axis of the pressure section 232 extends thereby along the actuation axis A of the control element 130. The pressure section 232 is designed to alter a curvature radius of the optical fiber 120 depending on the respective position of the control element 130.

The adjustment device 132 having the pressure section 232 is designed in particular thereby to be disposed at a spacing to the optical fiber 120 when the control element 130 is in the home position, and to bend the optical fiber 120 when the control element 130 is not in the home position. Positions of the control element 130 not in the home position are depicted by way of example in FIGS. 2B and 2C.

The spring device 260 is designed to apply a spring force to the control element 130 directed against the actuation force 131. According to the exemplary embodiment of the present disclosure depicted in FIG. 2A, the spring device 260 is designed as a plate spring. In particular, the spring device 260 is designed to regulate the multi-step movement of the control element 130 between the home position, the first actuation position, and the second actuation position. The optical fiber 120 is disposed thereby between the adjustment device 132 and the spring device 260. According to another exemplary embodiment, the shift device 110 can have numerous spring devices.

In the home position shown in FIG. 2A, a subsection of the control element 130 extends a from the housing 212 to a maximum extent, the adjustment device 132 is disposed with the pressure section 232 at a spacing to the optical fiber 120, the optical fiber 120 extends linearly, within installation tolerances, through the shift device 110, and the control element 130 and the spring device 260 are decoupled from one another in terms of the application of forces.

Figure 2B:
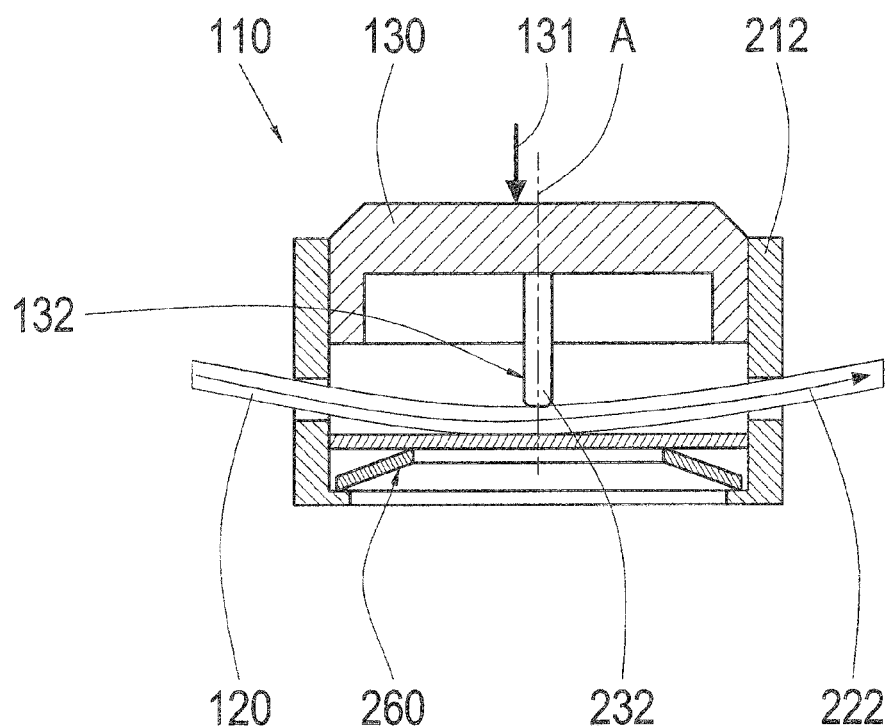

FIG. 2B shows the shift device 110 from FIG. 2A in a first actuation position of the control element 130. In the first actuation position shown in FIG. 2B, a smaller subsection of the control element 130 than the maximum subsection extends out of the housing 212, the adjustment device 132 is disposed with the pressure section 232 bearing against the optical fiber 120. As a result, the optical fiber 120 has a first curvature radius inside the housing 212. The spring device 260 remains in an uncompressed state.

Figure 2C:
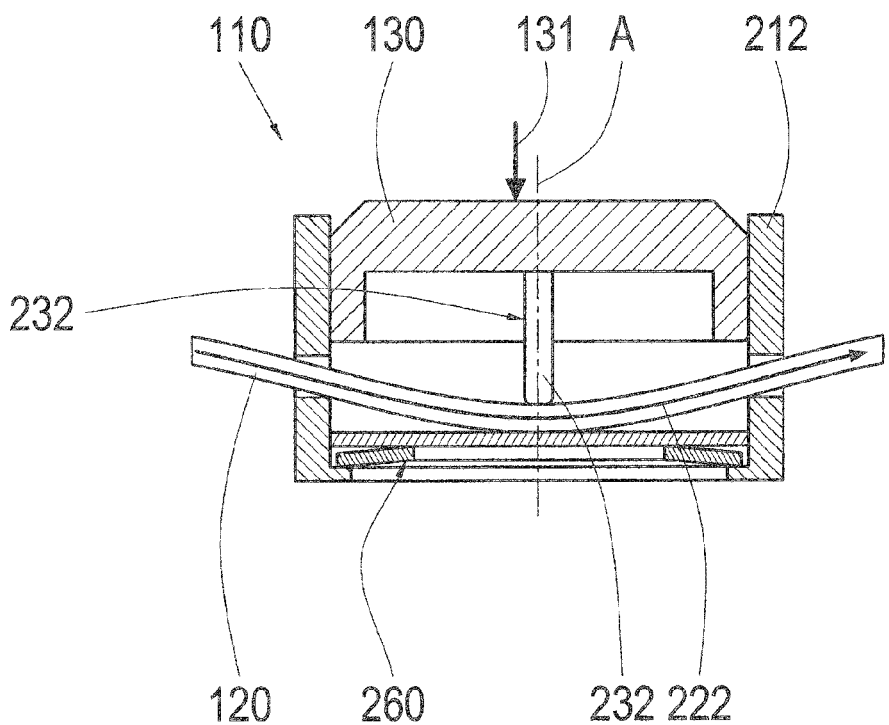

FIG. 2C shows the shift device 110 from FIG. 2A and FIG. 2B in a second actuation position of the control element 130. In the second actuation position shown in FIG. 2C, a minimum subsection of the control element 130 extends out of the housing 212. The adjustment device 132 is disposed with the pressure section 232 bearing against the optical fiber 120, and bends the optical fiber 120 against the spring device 260. The actuation force 131 is transferred to the spring device 260 via the adjustment device 132 and the optical fiber 120. The actuation force 131 is strong enough to deflect the spring device 260. As a result, the optical fiber 120 is more strongly bent than in the state shown in FIG. 2B. Thus, the optical fiber 120 has a second curvature radius inside the housing 212 in the state shown in FIG. 2C, which is smaller than the first curvature radius. The spring device 260 is in a state in which it is compressed by the control element 130 and the adjustment device 132.

In reference to FIGS. 2A to 2C, it should be noted that the shift device 110 as a button or a stepped switch having pressure sensors which act in a manner similar to fiber optic pressure sensors through deformation of the optical fiber 120. The transmission of the light signal 222 in the optical fiber 120 diminishes when the optical fiber 120 is bent or becomes curved by the adjustment device 132 when the shift device 110 or the control element 130 is actuated. A pressure effect or bending effect is altered in two steps by an elastic mechanism, in this case a spring device 260 placed beneath it, designed as a plate spring. When the control element 130 or the adjustment device 132 reaches the spring device 260, the pressure, or spring force, respectively, increases. According to one exemplary embodiment, multi-step buttons having an increasing spring resistance can be implemented by layering or stacking numerous spring devices 260, e.g. plate springs.

Figure 3A:
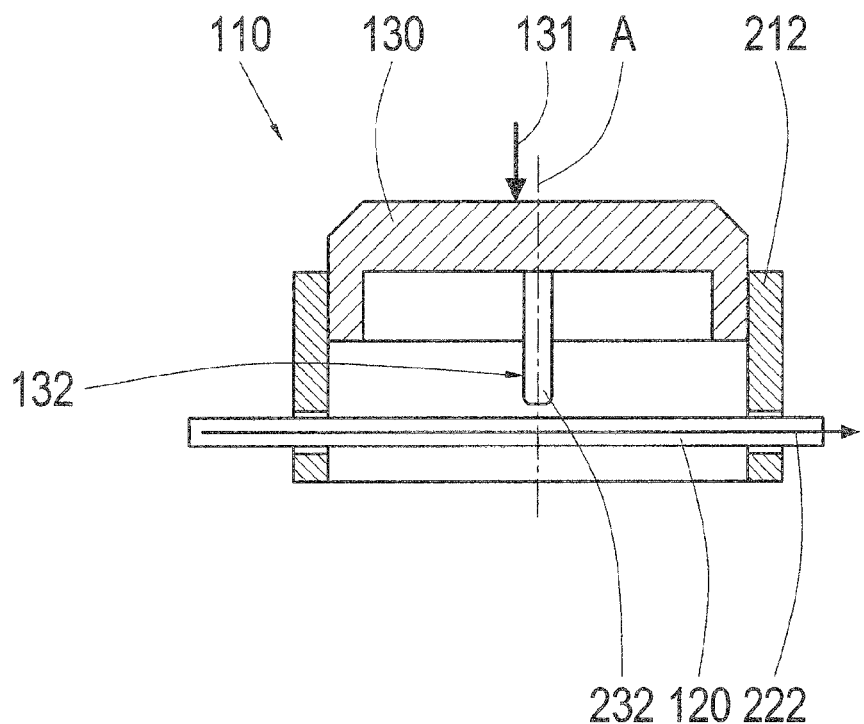

FIG. 3A shows a sectional view of a shift device 110 according to an exemplary embodiment of the present disclosure. The shift device 110 and the depiction in FIG. 3A correspond thereby to the shift device and the depiction from FIG. 2A, with the exception that the shift device 110 in FIG. 3A is shown without a spring device, or has no spring device, respectively. In FIG. 3A, the shift device 110 is shown with the control element 130 in the home position.

Figure 3B:
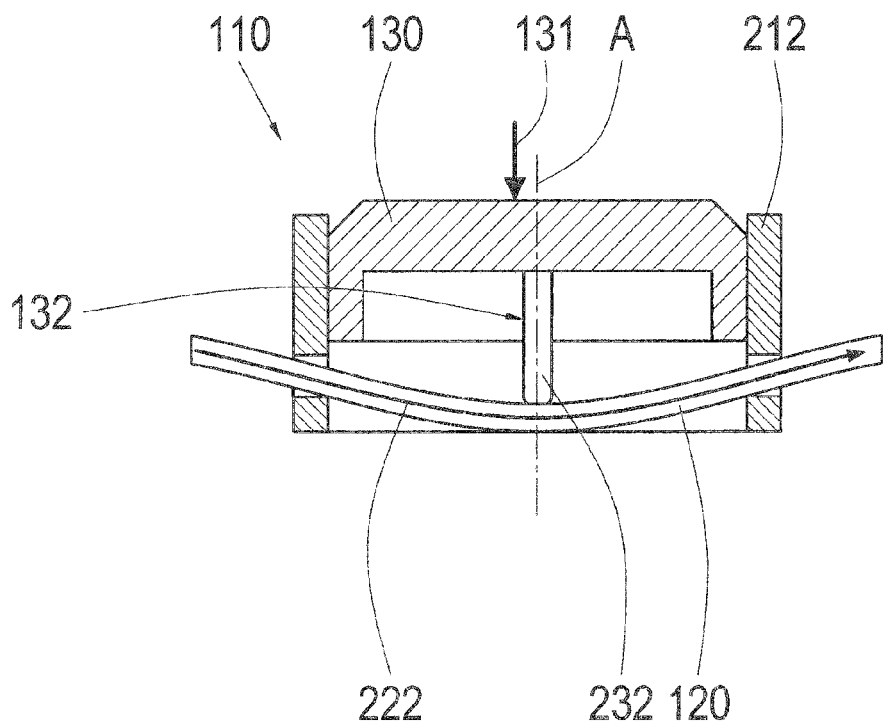

FIG. 3B shows the shift device 110 depicted in FIG. 3A with the control element 130 in an actuation position. The depiction in FIG. 3B ends thereby, in particular the depiction from FIG. 2B or FIG. 2C.

Figure 4:
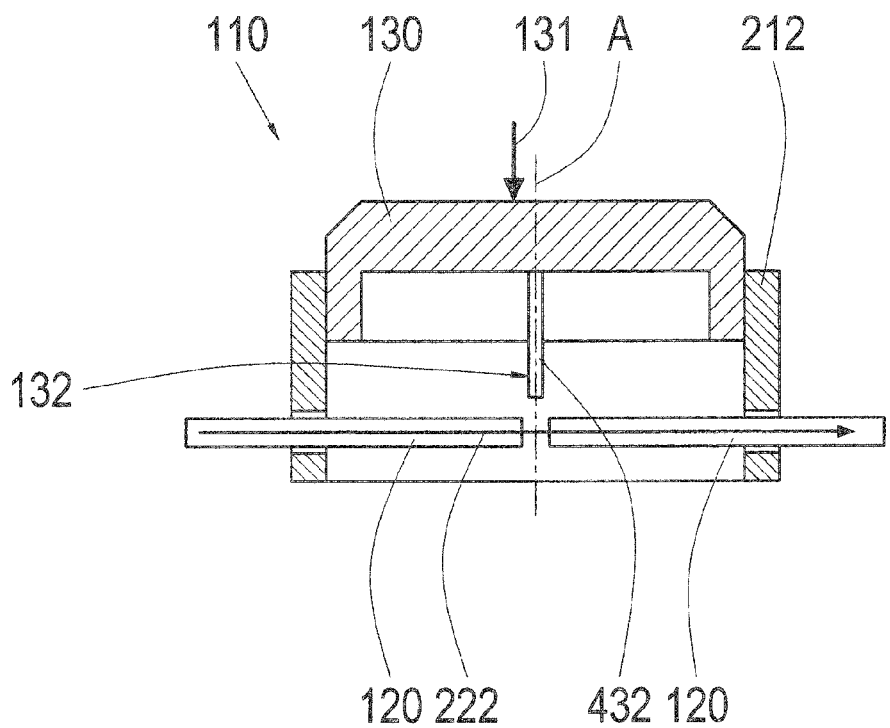

FIG. 4 shows a sectional view of a shift device 110 according to an exemplary embodiment of the present disclosure. The shift device 110 and the depiction in FIG. 4 correspond thereby to the shift device as well as the depiction from FIG. 3A, with the exception that in FIG. 4, the optical fiber 120 is interrupted inside the shift device 110, and that the shift device 110 has an interruption section 432, or a damper section, respectively. In FIG. 4, the shift device 110 is shown with the control element 130 in the home position.

The interrupted optical fiber 120 has an intermediate space filled with air between two subsections of the optical fiber 120. The two subsections of the optical fiber 120 extend along a common longitudinal axis of the optical fiber 120 inside the housing 212 of the shift device 110. The light signal 22, or the light path, runs from an input-side subsection of the optical fiber 120 through the intermediate space, into an output-side subsection of the optical fiber 120 when the control element 130 is in the home position.

The adjustment device 132 is made of an opaque material. The adjustment device 132 having the interruption section 432 is designed to at least partially allow the light signal 222 to pass through the optical fiber 120, or to at least partially interrupt the light signal, depending on a position of the control element 130. In the home position shown in FIG. 4, the adjustment device 132 is formed with the interruption section 432 in order to allow the light signal 222 to pass through the optical fiber 120. The adjustment device 132 is disposed thereby with the interruption section 432 outside of the intermediate space between the two subsections of the optical fiber 120. In an actuation position, the interruption section 432 can be designed to at least partially interrupt the light signal 222. The adjustment device 132 can extend thereby with the interruption section 432 into the intermediate space between the two subsections of the optical fiber 120 when the control element 130 is in an actuation position. By way of example, the interruption section 432 can be located outside the intermediate space in the home position, filling the intermediate space in part, e.g. filling half of the intermediate space, in the first actuation position, and entirely filling the intermediate space in the second actuation position.

Figure 5:
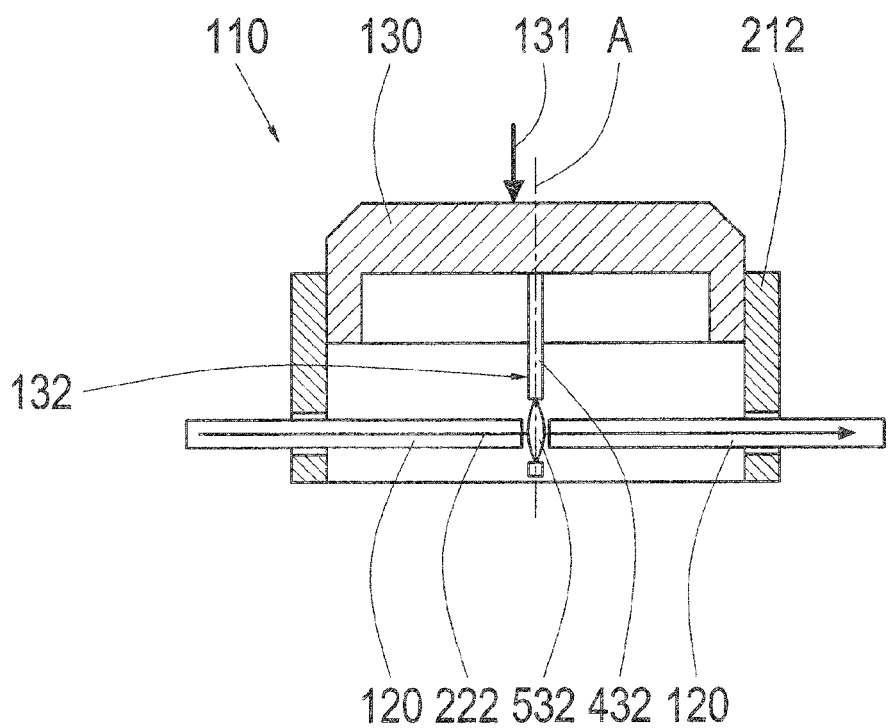

FIG. 5 shows a sectional view of a shift device 110 according to an exemplary embodiment of the present disclosure. The shift device 110 and the depiction in FIG. 5 correspond thereby to the shift device as well as the depiction from FIG. 4, with the exception that in FIG. 5, the shift device 110 has an adjustment device 132 having an interruption section 432, or a damper section having an additional optical element 532. In FIG. 5, the shift device 110 is shown with the control element 130 in the home position.

The adjustment device 132 has the interruption section 432 and the optical element 532 thereby. In the home position shown in FIG. 5, the optical element 532 of the adjustment device 132 is disposed in the intermediate space between the two subsections of the optical fiber 120. In the home position shown in FIG. 5, the adjustment device 132 is designed to at least partially allow the light signal 22 to pass through the optical fiber 120. In an actuation position, the adjustment device 132 can be designed to at least partially interrupt the light signal 222. The interruption section 432 of the adjustment device 132 can extend thereby into the intermediate space between the two subsections of the optical fiber 120 when the control element 130 is in an actuation position.

In reference to FIGS. 4 and 5, it should be noted that according to one exemplary embodiment, the shift device 110 can be designed as a button interrupting the light path. With a small diameter of the optical fiber 120, a nearly digital shifting behavior is obtained in the exemplary embodiment according to FIG. 4. In order to limit light losses, the optical element 532, or optical intermediate element is disposed such that it minimizes a reduction of a light passage of the optical signal 22 in an actuated state, or an actuation position, respectively, in relation to the standby state or home position.

Figure 6A:
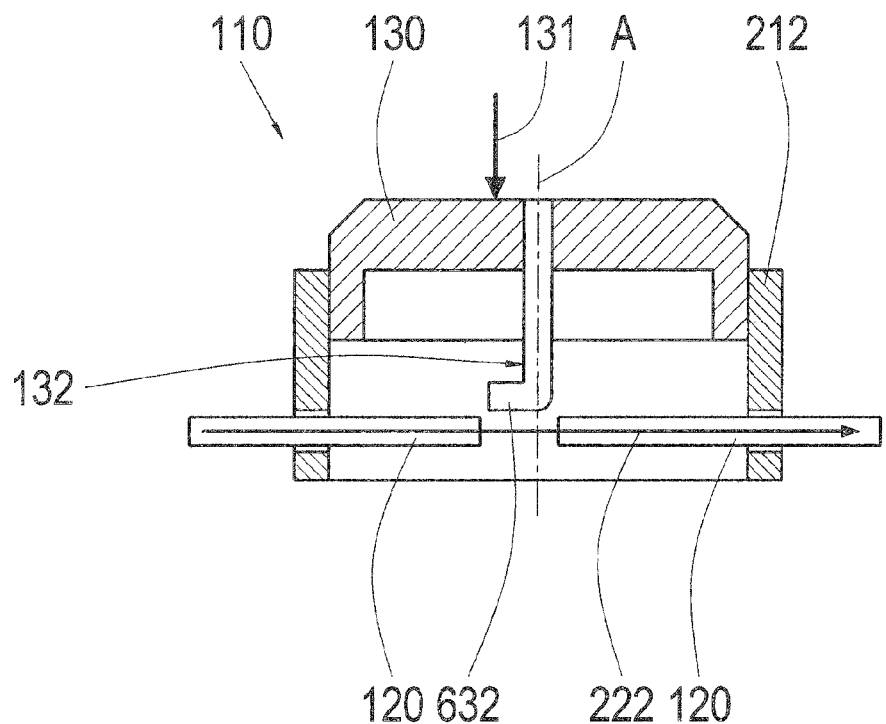

FIG. 6A shows a sectional view of a shift device 110 according to an exemplary embodiment of the present disclosure. The shift device 110 and the depiction in FIG. 6A correspond thereby to the shift device as well as the depiction from FIG. 3A, with the exception that in FIG. 6A, the optical fiber 120 is interrupted inside the shift device 110, and that the shift device 110 has a further optical fiber 632 as an adjustment device 132. In FIG. 6A, the shift device 110 is shown with the control element 130 in the home position.

The interrupted optical fiber 120 has an intermediate space filled with air between two subsections of the optical fiber 120. The two subsections of the optical fiber 120 extend along a common longitudinal axis of the optical fiber 120 inside the housing 212 of the shift device 110. The light signal 222, or the light path, respectively, runs from an input-side subsection of the optical fiber 120 through the intermediate space, into an output-side subsection of the optical fiber 120 when the control element 130 is in the home position.

The further optical fiber 632 extends from the control element 130 toward the optical fiber 120. The further optical fiber 632 has a first section, a bent section, and a second section. The first section extends along the actuation axis A of the shift device 110. The second section extends along a common longitudinal axis of the optical fiber 120 toward the input-side subsection of the optical fiber 120. The bent section of the further optical fiber 120 is disposed between the first section and the second section.

The adjustment device 132 having the further optical fiber 632 is designed to at least partially allow the light signal 22 to pass through the optical fiber 120, and additionally or alternatively, to at least partially redirect it to the control element 130, depending on a position of the control element 130. In the home position shown in FIG. 6A, the adjustment device 132 having the further optical fiber 632 is designed to allow the light signal 222 to pass through the optical fiber 120. The adjustment device 132 having the further optical fiber 632 is disposed thereby outside the intermediate space between the two subsections of the optical fiber 120.

Figure 6B:
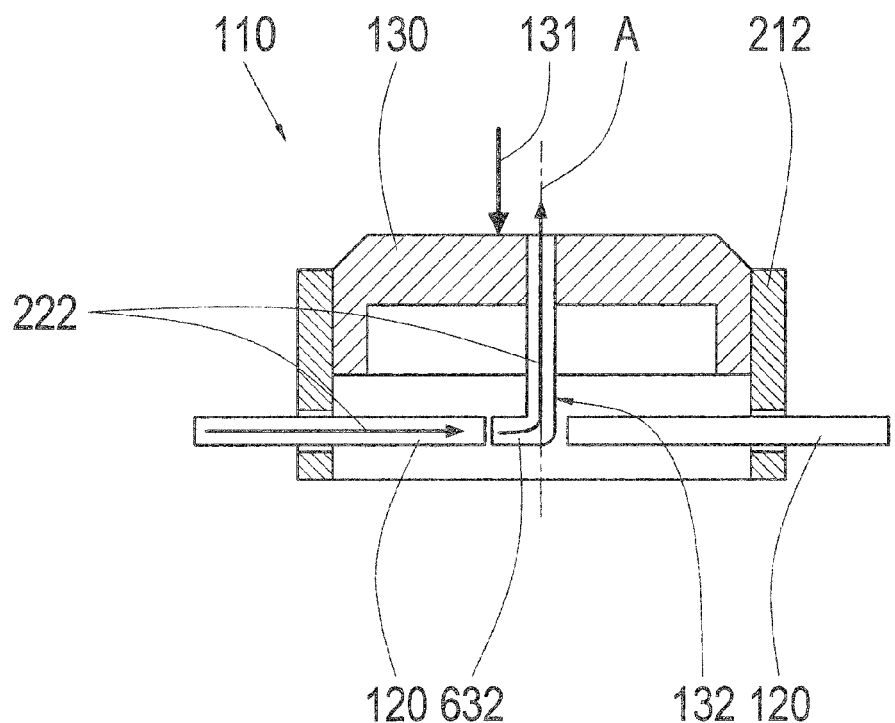

FIG. 6B shows the shift device 110 from FIG. 6A, with the control element 130 in an actuation position. The second section of the further optical fiber 632 of the adjustment device 132 is disposed thereby entirely in the intermediate space between the two subsections of the optical fiber 120. The light signal 222 exits the input-side subsection of the optical fiber 120 and enters the further optical fiber 632. A light path runs to the control element 130 thereby. In the actuation position shown in FIG. 6B, the adjustment device 132 having the further optical fiber 632 is designed to redirect the light signal 222 entirely to the control element 130. The adjustment device 132 having the further optical fiber 632 can extend into the intermediate space between the two subsections of the optical fiber 120 when the control element 130 is in the actuation position.

According to another exemplary embodiment, the second section of the further optical fiber 632 can be disposed only partially in the intermediate space in another actuation position, such that a first portion of the light signal 222 is redirected from the further optical fiber 632, and a second portion of the light signal 222 can pass through the output-side subsection of the optical fiber 120.

In reference to FIGS. 6A and 6B, it should be noted that in the depicted shift device 110, a redirection of the light path, or the light signal 222, respectively, occurs when the control element 130 is in an actuation position. When the button is actuated, the further optical fiber 632 is brought into a beam path of the light signal 222. With large switches having lighting, an actuation position can also be optically indicated by a greater brightness of a switch image of the control element 130.

Figure 7A:
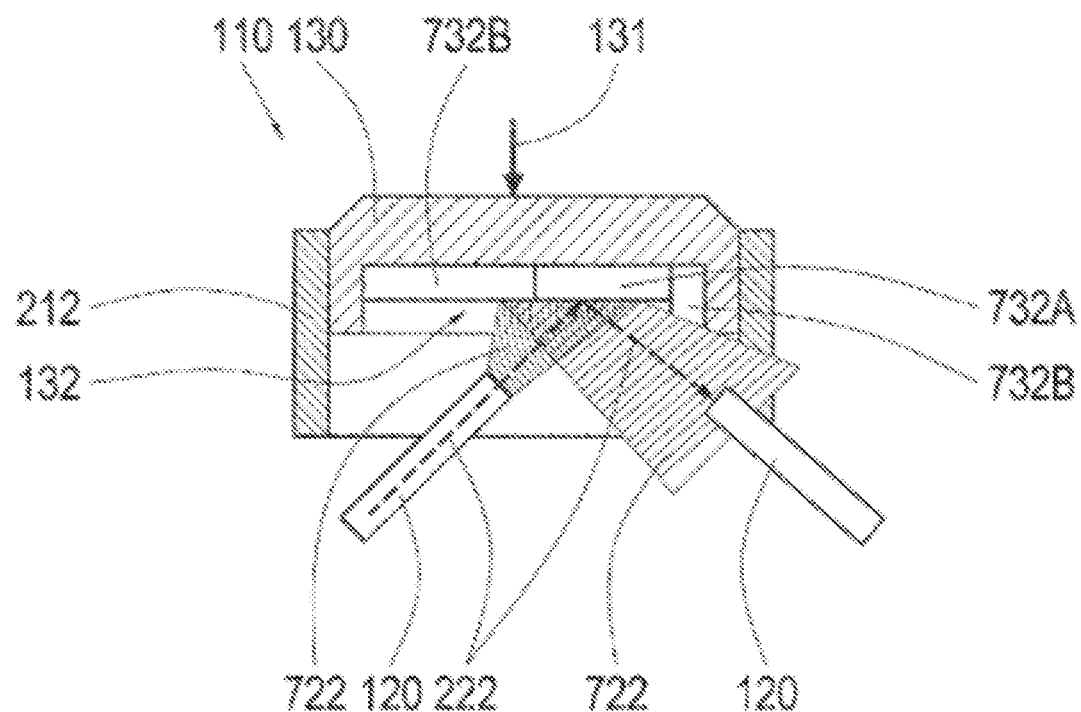

FIG. 7A shows a sectional view of a shift device 110 according to an exemplary embodiment of the present disclosure. The shift device 110 and the depiction in FIG. 7A correspond thereby to the shift device as well as the depiction from FIG. 3A, with the exception that in FIG. 7A, the optical fiber 120 is interrupted inside the shift device 110, wherein subsections of the optical fiber 120 have longitudinal axes that are angled in relation to one another, and that the shift device 110 has an adjustment device 130 having a reflector 732A and two absorbers 732B, by way of example. The shift device 110 is shown with the control device 130 in the home position in FIG. 7A.

The interrupted optical fiber 120 has an intermediate space filled with air between the two subsections of the optical fiber 120. The two subsections of the optical fiber 120 extend along longitudinal axes angled in relation to one another inside the housing 212 of the shift device 110. The adjustment device 132 having the reflector 732A and the absorbers 732B is disposed on a side of the control element 130 facing the optical fiber 120. The reflector 732A is disposed thereby between a first absorber 732B and a second absorber 732B. The reflector 732A is designed thereby as a mirror, or made of an optically reflecting material. The absorbers 732B are painted matt black, for example. The absorbers 732B are designed thereby to absorb at least a portion of the optical signal 222.

The adjustment device 132 having the reflector 732A and the absorbers 732B is designed to allow the light signal 222 to pass at least partially through the optical fiber 120, or to at least partially dampen it and additionally or alternatively to interrupt it, depending on a position of the control element 130. In the home position shown in FIG. 7A, the adjustment device 132 having the reflector 732A and the absorbers 732B is designed to allow the light signal 222 to pass through the optical fiber 120. The light signal 222, or the light path, respectively, runs thereby from an input-side subsection of the optical fiber 120 in the form of a light beam through the intermediate space, to the reflector 732A, and is reflected on the reflector 732A into an output-side subsection of the optical fiber 120, when the control element 130 is in the home position.

Figure 7B:
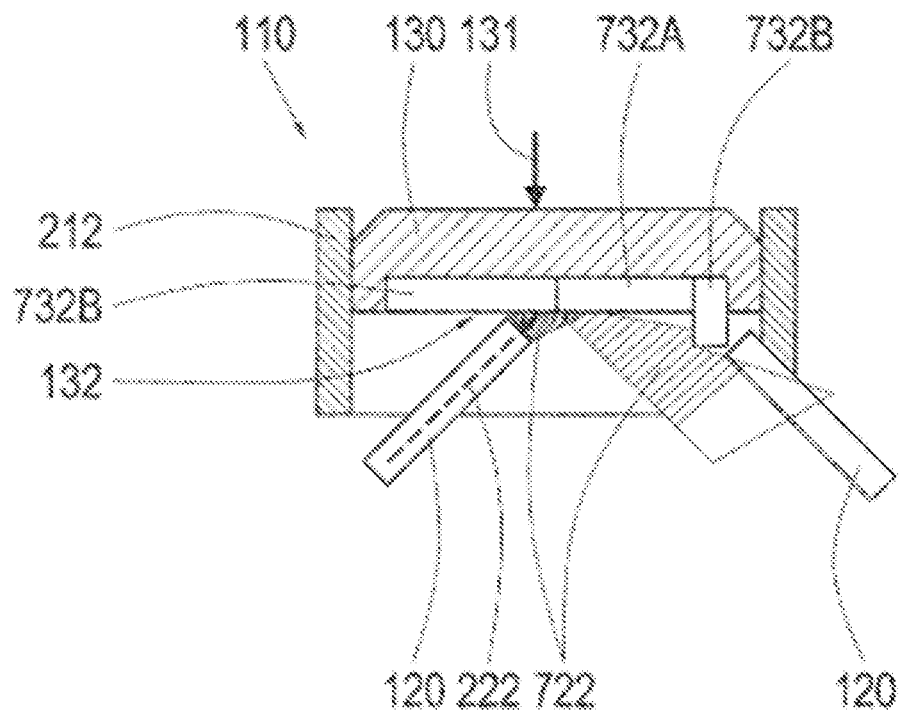

FIG. 7B shows the shift device 110 from FIG. 7A with the control element 130 in an actuation position. In the actuation position shown in FIG. 7B, the adjustment device 130 having the reflector 732A and the absorbers 732B is designed to at least partially dampen, and additionally or alternatively, interrupt the light signal 222 in the optical fiber 120. The light signal 222, or the light path, respectively, runs thereby from an input-side subsection of the optical fiber 120 in the form of the light beam 722, through the intermediate space, to the first absorber 732B, and is at least partially absorbed by the absorber 732B, when the control element 130 is in the actuation position. The second absorber 732B is disposed and designed to shield a portion of the light signal 222 reflected to the output-side subsection of the optical fiber 120 from the output-side subsection of the optical fiber 120.

With respect to FIGS. 7A and 7B, it should be noted that the shift device 110 is designed as a button that reflects or absorbs the light signal 222, depending on the position. The light beam 722 or ray of light exiting the input-side subsection of the optical fiber 120 is reflected on an undersurface of the control element 130 thereby, into the output-side subsection of the optical fiber 120. In the home position, the input-side subsection of the optical fiber 120 is pointed at the reflector 732A, and the light signal is thus reflected on a bright or reflecting surface. If the control element 130 is pressed, and thus moved into an actuation position, the reflector 732A or the reflection surface, respectively, is displaced in relation to the input-side subsection of the optical fiber 120. A growing portion of the light signal 222 is directed toward the absorber 732B, or a black surface, respectively, which absorbs the light signal 222. The second absorber 732B, or a shutter, respectively, covers the output-side subsection of the optical fiber 120 when the control element 130 is in a fully actuated position, for example. In this manner, a relatively analog response behavior of the shift device 110 is obtained, from which it can also be determined to what extent the control element 130 has been pressed. According to one exemplary embodiment, an optical element can be disposed in front of an entry of the light signal 222 into the output-side subsection of the optical fiber 120.

Exemplary embodiments of the present disclosure, variations and further aspects shall be summarized and explained in other words with reference to FIGS. 1 to 7B.

According to one exemplary embodiment, the adjustment device 132 of the shift device 110 can have at least one polarization filter. A weakening of the luminous flux of the light signal 222 can be obtained thereby through polarizing filters. According to one exemplary embodiment, the shift device 110 can be designed as a switch.

According to exemplary embodiments of the present disclosure, a detection of button and switch signals in a gearshift lever of a vehicle can occur using optical fibers, wherein the adjustment device 132, 232, 432, 532, 632, 732A, 732B can function as a separating mechanism, in order to interrupt or dampen the luminous flux of the light signal 222, depending on a position of the control element 130. A shift device 110 is also provided thereby with a multi-step design of a switch and additionally or alternatively having a closed or single-piece optical fiber loop, or an open or two-piece optical fiber loop. The luminous flux of the light signal 222 can be weakened thereby via reflection on various absorbing media through actuation of the switch, the luminous flux of the light signal 222 can be weakened via polarizing filters by the actuation of the switch, and additionally or alternatively, an optical intermediate element can reduce transmission losses in the open optical fiber 120.

According to one exemplary embodiment, a switching of the luminous flux of the light signal 222, or the coupling device 142, or a light source can be obtained, wherein a darker state can be selected such that with numerous switching states, a state that will not malfunction, or a fail-safe state, can be signaled with the dark state. The luminous flux can be sent through the at least one optical fiber 120. The luminous flux for a disengagement button, or an unlocking button on a gearshift lever of a vehicle is thus switched on when a driver actuates the brake pedal. The switching of the luminous flux can also be carried out by a transmission of the vehicle. This can be used as a second safeguard against malfunctions of the gearshift lever when outputting the gear step.

The exemplary embodiments described herein and illustrated in the Figures are only selected by way of example. Different exemplary embodiments can be combined in their entirety or with respect to individual features. Furthermore, an exemplary embodiment can be supplemented by features of another exemplary embodiment.

Moreover, method steps according to the disclosure can be repeated or executed in a sequence differing from that described herein.

If an exemplary embodiment comprises an "and/or" conjunction between a first feature and a second feature, this can be read to mean that the exemplary embodiment according to one embodiment has both the first and the second feature, and according to another embodiment, has either just the first or just the second feature.

REFERENCE SYMBOLS 100 control system
110 shift device
120 optical fiber
130 control element
131 actuation force
132 adjustment device
140 control device
142 coupling device, or light source
144 detection device or phototransistor
150 control signal
212 housing
222 light signal or light path
232 pressure section
260 spring device or plate spring, or elastic element
A actuation axis or movement axis
432 interruption section
532 optical element
632 further optical fiber
722 light beam
732A reflector
732B absorber

The invention claimed is:

1. A shift device for a control system for a vehicle, the shift device comprising:
   at least one optical fiber that is continuous through the shift device, the at least one optical fiber being configured for conducting a light signal, wherein the light signal has an input characteristic when entering the shift device, and wherein the light signal has an output characteristic when exiting the shift device; and
   a control element, wherein the control element can be moved between a home position, a first actuation position, and a second actuation position by an actuation force,
   wherein the control element has an adjustment device for adjusting the characteristic of the light signal,
   wherein the adjustment device is configured to set the output characteristic of the light signal to a first value when the control element is in the home position, wherein the adjustment device is configured to set the output characteristic of the light signal to a second value when in the first actuation position, wherein the adjustment device is configured to set the output characteristic of the light signal to a third value when in the second actuation position, and wherein the first value, the second value, and the third value differ from one another, wherein the adjustment device has at least one pressure section, and wherein the at least one pressure section is configured to alter a curvature radius of the at least one optical fiber based on the position of the control element.

2. The shift device according to claim 1, wherein the adjustment device has at least one damper section, wherein the at least one damper section is configured to at least partially allow the light signal to pass through the at least one optical fiber when the control element is in a position.

3. The shift device according to claim 1, wherein the adjustment device has a second optical fiber in addition to the at least one optical fiber, wherein the second optical fiber is configured to allow the light signal to at least partially pass through the at least one optical fiber when the control element is in a position.

4. The shift device according to claim 1, wherein the input characteristic and the output characteristic of the light signal each include at least one of a light intensity or a luminous flux.

5. The shift device according to claim 1, wherein the first value of the output characteristic represents a maximum value, and wherein the third value of the output characteristic represents a minimum value.

6. The shift device according to claim 1, further comprising at least one spring device for applying a spring force counter to the actuation force to the control element, wherein the spring device is configured to regulate a movement of the control element between the home position, the first actuation position, and the second actuation position.

7. The shift device according to claim 6, wherein when the control element is in the home position and when the at least one spring device is not providing a spring force, a transfer of force between the control element and the spring device is at a minimum in the first actuation position, and the transfer of force between the control element and the spring device is at a maximum in the second actuation position.

8. The shift device according to claim 1, wherein the control element has at least one of a button, a switch, a rocker button, a rocker switch, and a slider.

9. The shift device according to claim 1, wherein the shift device has at least one spring device for applying a spring force to the control element, the spring force being counter to the actuation force, wherein the spring device is configured to regulate a movement of the control element between the home position, the first actuation position, and the second actuation position, and wherein the optical fiber is disposed between the at least one pressure section and the spring device.

10. A control system for a vehicle, wherein the control system comprising:

a shift device according to claim 1; and a control device, wherein the shift device is connected to the control device by the at least one optical fiber such that it is capable of data transfer with the shift device, wherein the control device has a coupling device for coupling with the light signal, wherein the control device has a detection device for determining the output characteristic of the light signal emitted from the at least one optical fiber, and wherein the control device is configured to generate a control signal depending on a value of the output characteristic of the light signal.

11. The control system according to claim 10, wherein the control device is configured to transmit the control signal to a motor control device.

12. The control system according to claim 11, wherein the control device is configured to generate a first control signal in response to the second value of the output characteristic, wherein the first control signal represents a pre-selection signal for pre-selecting a transmission step, wherein the control device is configured to generate a second control signal in response to the third value of the output characteristic, and wherein the second control signal represents a shifting signal for setting a transmission step.

13. The control system according to claim 11, wherein the control device is configured to generate a first control signal in response to the second value of the output characteristic, wherein the first control signal represents a motor start-up signal, wherein the control device is configured to generate a second control signal in response to the third value of the output characteristic, and wherein the second control signal represents an unlocking signal for releasing a transmission lock.

14. The control system according to claim 10, wherein the control device is configured to transmit the control signal to a transmission control device.

15. The shift device according to claim 1, wherein the adjustment device has at least one damper section, wherein the at least one damper section is configured to at least partially dampen the light signal when the control element is in a position.

16. The shift device according to claim 1, wherein the adjustment device has a second optical fiber in addition to the at least one optical fiber, wherein the second optical fiber is configured to at least partially redirect the light signal to the control element when the control element is in a position.

* * * * *